United States Patent
Kimberly et al.

(10) Patent No.: US 9,329,802 B2
(45) Date of Patent: May 3, 2016

(54) FAIL SAFE REFRESH OF DATA STORED IN NAND MEMORY DEVICE

(71) Applicant: QUALCOMM Incorporated, San Diego, CA (US)

(72) Inventors: William Edward Kimberly, San Diego, CA (US); Benish Babu, San Diego, CA (US); Richard Patrick, San Diego, CA (US); Efrain Ortuno, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 135 days.

(21) Appl. No.: 14/195,928

(22) Filed: Mar. 4, 2014

(65) Prior Publication Data

US 2015/0134888 A1  May 14, 2015

Related U.S. Application Data (60) Provisional application No. 61/902,394, filed on Nov. 11, 2013.

(51) Int. Cl.
*G11C 16/10*     (2006.01)
*G11C 11/406*   (2006.01)
(Continued)

(52) U.S. Cl.
CPC .............. *G06F 3/0679* (2013.01); *G06F 3/064* (2013.01); *G06F 3/0616* (2013.01); *G11C 16/105* (2013.01); *G11C 16/22* (2013.01); *G11C 16/3418* (2013.01); *G06F 12/0246* (2013.01)

(58) Field of Classification Search
None
See application file for complete search history.

(56) References Cited

U.S. PATENT DOCUMENTS 7,710,777 B1   5/2010   Montierth et al.
8,050,095 B2  11/2011   Gonzalez et al.
(Continued)

FOREIGN PATENT DOCUMENTS

WO        2009042298 A1      4/2009
WO   WO 2009042298 A1  *   4/2009   ......... G11C 16/3431

OTHER PUBLICATIONS

Cai Yu, et al., "Flash correct-and-refresh: Retention-aware error management for increased flash memory lifetime", 2012 IEEE 30th International Conference on Computer Design (ICCD), Sep. 1, 2012, pp. 94-101, XP055168064, DOI: 10.1109/ICCD.2012.6378623 ISBN: 978-1-46-733050-3 p. 1-page 5; figures 1-6.

(Continued)

*Primary Examiner* — Reginald Bragdon
*Assistant Examiner* — Edward Wang
(74) *Attorney, Agent, or Firm* — The Marbury Law Group, PLLC (57) ABSTRACT

Methods, systems and devices provide for refreshing a data image stored on a NAND memory device. Aspects include sequentially copying each of a series of static data partitions into a scrub portion that does not store data image partitions identified in the partition table. The sequential copying begins with a last static data partition and proceeds sequentially to a first static data partition when the scrub portion occupies higher order addresses than the last address of the last static data partition. Alternatively, the sequential copying begins with the first static data partition and proceeds sequentially to the last static data partition when the scrub portion occupies addresses that are lower than the first address of the first static data partition. The partition table may be updated as each static data partition is stored to the scrub portion. Such operations enable fail-safe scrubbing and refreshing of data in a NAND device.

30 Claims, 7 Drawing Sheets

(51) Int. Cl.
*G06F 3/06* (2006.01)
*G11C 16/22* (2006.01)
*G11C 16/34* (2006.01)
*G06F 12/02* (2006.01)

(56) References Cited

U.S. PATENT DOCUMENTS

2003/0009721 A1 1/2003 Hsu et al.
2004/0065744 A1 4/2004 Shiraishi et al.
2009/0172267 A1 7/2009 Oribe et al.
2011/0047322 A1 2/2011 Allen et al.
2013/0058145 A1 3/2013 Yu et al.
2013/0166990 A1 6/2013 Morris et al.

OTHER PUBLICATIONS

International Search Report and Written Opinion—PCT/US2014/064661—ISA/EPO—Feb. 17, 2015.

* cited by examiner

FAIL SAFE REFRESH OF DATA STORED IN NAND MEMORY DEVICE

RELATED APPLICATIONS

This application claims the benefit of priority to U.S. Provisional Application No. 61/902,394 filed Nov. 11, 2013 entitled "Fail Safe Refresh of Data Stored in NAND Memory Device," the entire contents of which are hereby incorporated by reference for all purposes.

BACKGROUND

Flash memory is a non-volatile computer storage chip that can be electrically erased and reprogrammed. NAND flash memory (also referred to as a "NAND memory device" or simply "NAND") is a high density type of read-write memory that may be programmed and read in blocks or pages. NAND memory devices are used in memory cards, USB flash drives, solid-state drives, and similar products, for general storage and transfer of data, as well as to store configuration data in numerous digital devices including computing devices. A property of NAND is that all or part of the data image stored therein can be rewritten and thus updated. As used herein, the term "data image" refers to the information stored in one or more memory cells of a NAND.

NAND are typically organized into a number of blocks, with each block consisting of a number of pages. A "block" as it relates to flash memory, and particularly NAND, includes a sequence of storage bytes or bits, having a nominal length. That length is referred to as the block size. The process of storing data into blocks is normally accomplished a whole page at a time, while erasing data is done in units of blocks.

A data image stored on a NAND is commonly divided into multiple logical storage units, referred to as "partitions." Partitions group together blocks that are associated to one another. The organization of the blocks and their associated partitions may be maintained by a partition table on the NAND, including pointers that map block addresses.

NAND memory device are often used to store two categories of data, namely static data and dynamic data. Static data is generally used to configure a computing device, such as to give it certain functionality that is stable, and thus static data is typically never or very rarely modified. Compiled code associated with boot loaders, core security, resource connectivity and power management are some examples of static data often stored in NAND memory devices. In contrast, dynamic data includes data that is typically changed frequently, such as application data, files and system operating data.

Over time, the data image stored in a NAND may degrade as the material state used to store data may changes due to thermal diffusion processes that can cause some data bits to be lost, which may result in a corrupted data image. To avoid loss of the data image, a NAND memory device must be periodically reprogrammed to refresh the data image.

SUMMARY

The various aspects include methods, systems and devices for refreshing a data image stored on a NAND memory device. Data stored on a NAND memory device may be divided into partitions stored sequentially in the NAND memory device. A first partition of data may be stored in the NAND memory device beginning at a first address, a last partition of data may be stored in the NAND memory device ending at a last address, and addresses of each partition are stored in a partition table. Data stored on a NAND memory device may include dynamic data that is frequently rewritten or revised, and static data that is rarely if ever changed (e.g., operating system software). Thus, data stored on a NAND memory device may include a number of partitions of dynamic data followed (or proceed) by a number of partitions of static data. Some portions of the NAND memory space may not contain data or may contain data that is no longer referenced in the partition table; this unused memory space may be used for purposes of refreshing a data image, and is referred to herein generally as a "scrub portion."

In an aspect, a method for refreshing a static data image stored on a NAND memory device may include sequentially copying each of a series of static data partitions into a scrub portion of the NAND memory device that does not store data image partitions identified in the partition table. The sequential copying of each of the series of static data partitions begins with a last static data partition and proceeds sequentially to a first static data partition when the scrub portion occupies higher order addresses than the last address of the last static data partition, and the sequential copying of each of the series of static data partitions begins with the first static data partition and proceeds sequentially to the last static data partition when the scrub portion occupies addresses that are lower than the first address of the first static data partition. Also, the partition table is updated as each static data partition is stored to the scrub portion.

Further aspects include reading or starting a clock upon refreshing the data image on the NAND memory device. At a later time, a determination may be made regarding whether the clock indicates that the data image should be refreshed, and the operations of refreshing the data image on the NAND memory device may be performed in response to determining that the clock indicates that the data image should be refreshed.

Further aspects may include determining whether the scrub portion occupies higher order addresses than the series of static data partitions based on partition addresses stored in the partition table. Also, determining whether the scrub portion occupies higher order addresses than the series of static data partitions may be based on a datum stored in the NAND memory device that is set based on whether partitions were last copied to addresses higher than the last static data partition or to addresses lower than the first static data partition. Additionally, the NAND memory device may include both static data and dynamic data stored as part of the data image, such that the series of static data partitions contain static data and other partitions not included in the series of static data partitions include dynamic data.

Further aspects may include copying the last static data partition so that it ends at a highest order address within the NAND memory device when the scrub portion occupies higher order addresses than the last address of the last static data partition comprises. Alternatively, the first static data partition may be copied so that it begins at a lowest order address within the NAND memory device when the scrub portion occupies lower order addresses than the first address of the first static data partition. Additionally, at least one of the series of static data partitions may be copied to an address previously occupied by at least one other of the series of static data partitions before performing the operations of refreshing the data image on the NAND device.

In a further aspect there may be two partition tables with the later updated partition table used by the computing system to access the data stored in the NAND device. In this aspect, updating the partition table may alternate between the two partition tables including updating a rolling counter of the updated one of the two partition tables. Such a roller counter may indicate which of the two partition tables was last refreshed and/or indicate the older one of the two partition tables that needs to be updated after each of the series of partitions is copied. Also, updating the partition table may include saving a time value in a system file reflecting when the partition table was last updated.

Further aspects include a computing device having a NAND memory device and a processor coupled to the NAND memory device that is configured with processor-executable instructions to perform various operations corresponding to the methods discussed above.

Further aspects include a computing device having various means for performing functions corresponding to the method operations discussed above.

Further aspects include a non-transitory processor-readable storage medium having stored thereon processor-executable instructions configured to cause a processor to perform various operations corresponding to the method operations discussed above.

BRIEF DESCRIPTION OF THE DRAWINGS

The accompanying drawings, which are incorporated herein and constitute part of this specification, illustrate exemplary aspects of the invention, and, together with the general description given above and the detailed description given below, serve to explain features of the invention.

DETAILED DESCRIPTION

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. Alternate aspects may be devised without departing from the scope of the disclosure. Additionally, well-known elements of the disclosure will not be described in detail or will be omitted so as not to obscure the relevant details of the disclosure.

The word "exemplary" is used herein to mean "serving as an example, instance, or illustration." Any implementation described herein as "exemplary" is not necessarily to be construed as preferred or advantageous over other implementations. Additionally, use of the words, "first," "second," "third," "initial," or similar verbiage is intended herein for clarity purposes to distinguish various described elements and is not intended to limit the invention to a particular order or hierarchy of elements.

The terms "access" or "accessing" as used herein refer to the act of interacting with an electronic storage device, or if specified a particular portion thereof, for the purpose of scanning or reading data or information thereon. Also, the terms "scan" or "scanning" as used herein mean examining, interpreting or reviewing data or information, particularly in an electronic storage device. In contrast, the terms "read" or "reading" as used herein mean obtaining, extracting, or retrieving data or information, particularly in an electronic storage device. The terms "copy" or "copying" as used herein means reproducing or creating a virtually identical version of one set of data from one location in another location. The terms "sequential" or "sequentially" as used herein refers to occurring or following in a sequential order such as first to last, last to first, lowest order address to highest order address, highest order address to lowest order address, etc.

The various aspects provide methods, devices and/or systems for refreshing a static data image on NAND memory devices. The process of refreshing all or portions of a data image by reprogramming is also referred to herein as "scrubbing" or a "scrub." The process of scrubbing may including reading from particular memory locations, correcting bit errors (if any) with an error-correction code (ECC), and writing the corrected data to another location or back to the same location. The static data image stored on a NAND memory device may be periodically scrubbed (i.e., refreshed by reprogramming) in order to ensure the data remains correct and readable over time. However, the reprogramming of a NAND memory device may be complicated by the fact that it must be done in a fail safe manner that does not impact dynamic data or other static data not intended to be reprogrammed, and that can accommodate possible events, such as a loss of power in the middle of reprogramming. Also, the exact time it takes to degrade a particular NAND will vary greatly, depending on temperature, the conditions to which it is exposed and usage. The period may be as short as three or four months or over years. Thus, to prevent data loss, static data stored on the NAND should be periodically refreshed, while not affecting other data, such as dynamic data, stored therein. The various aspects promote data retention in read-write memory devices, such as NAND memory devices, by enabling fail-safe updating of static data and its handling.

Similar to master boot record (MBR) or GUID partition table (GPT) partitioning schemes, NAND partitions may be managed in software. That software may maintain and update partition tables stored in the NAND memory device as part of refreshing static data. Also, in order to determine whether the static data needs to be refreshed a counter, time value or other indication of the last refresh of the static data image or the next required refresh of the static data image may be stored in a file system, such as in system memory or with other dynamic data stored on the NAND memory device. That counter, time value or other indication may be periodically checked and/or a timer set that may be used to trigger a refresh of the static data image at the desired time in the future, such as four months from the last time the static data was scrubbed.

Figure 1:
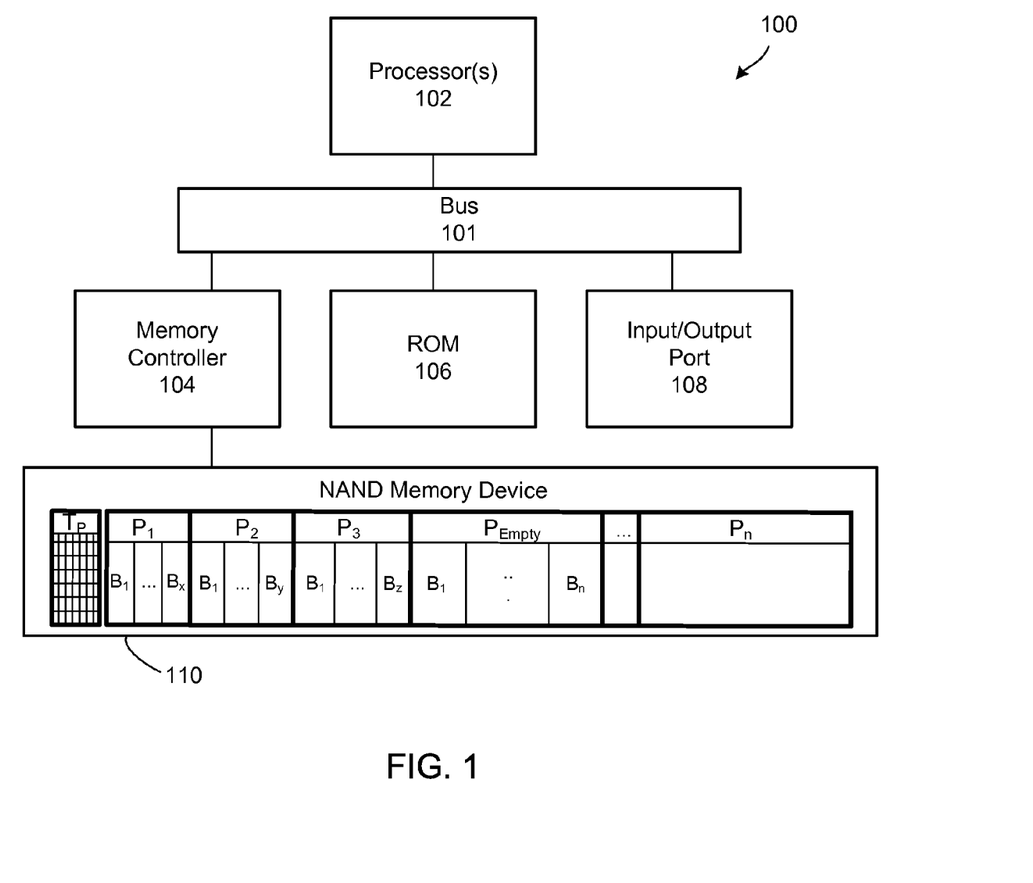
FIG. 1 is a schematic block diagram of a read-write memory device packaging in accordance with an aspect.

FIG. 1 illustrates a block diagram of a computing device 100 including a NAND memory device 110 in accordance with aspects disclosed herein. The computing device 100 may include a system bus 101 that allows processor(s) 102, read-only memory (ROM) 106, one or more input/output ports 108 and memory controller 104 to communicate. Additionally, a NAND memory device 110 may be configured to interface with system bus 101 through the memory controller 104. The computing device 100 may include other components not illustrated, such as display/output devices or networking devices. Also, the computing device 100 may be implemented on a single computer chip or as a system on chip (SOC).

A NAND memory device 110 may be included in the hardware of computing device 100 as a permanent memory device. Also, NAND memory device 110 may be implemented as a multi-chip module or on multiple discrete components that may form a chip set and used together. Data may be stored, accessed and read from NAND memory device 110. Additionally, data stored in NAND memory device 110 may be written and erased as appropriate. The memory controller 104 may be incorporated into the NAND memory device 110 as a single chip or as a separate component. The memory controller 104 may be configured to control the NAND memory device 110, such as the process of partitioning data, updating one or more partition tables, reading data, copying data, storing data, and erasing data. In the various aspects, a data image stored on the NAND memory device 110 may be partitioned into a series of static data partitions $P_1$-$P_3$, as well as additional partitions including empty blocks $P_{Empty}$ and further partitions, including dynamic data partitions $P_n$ used for storing dynamic data.

Figure 2A:
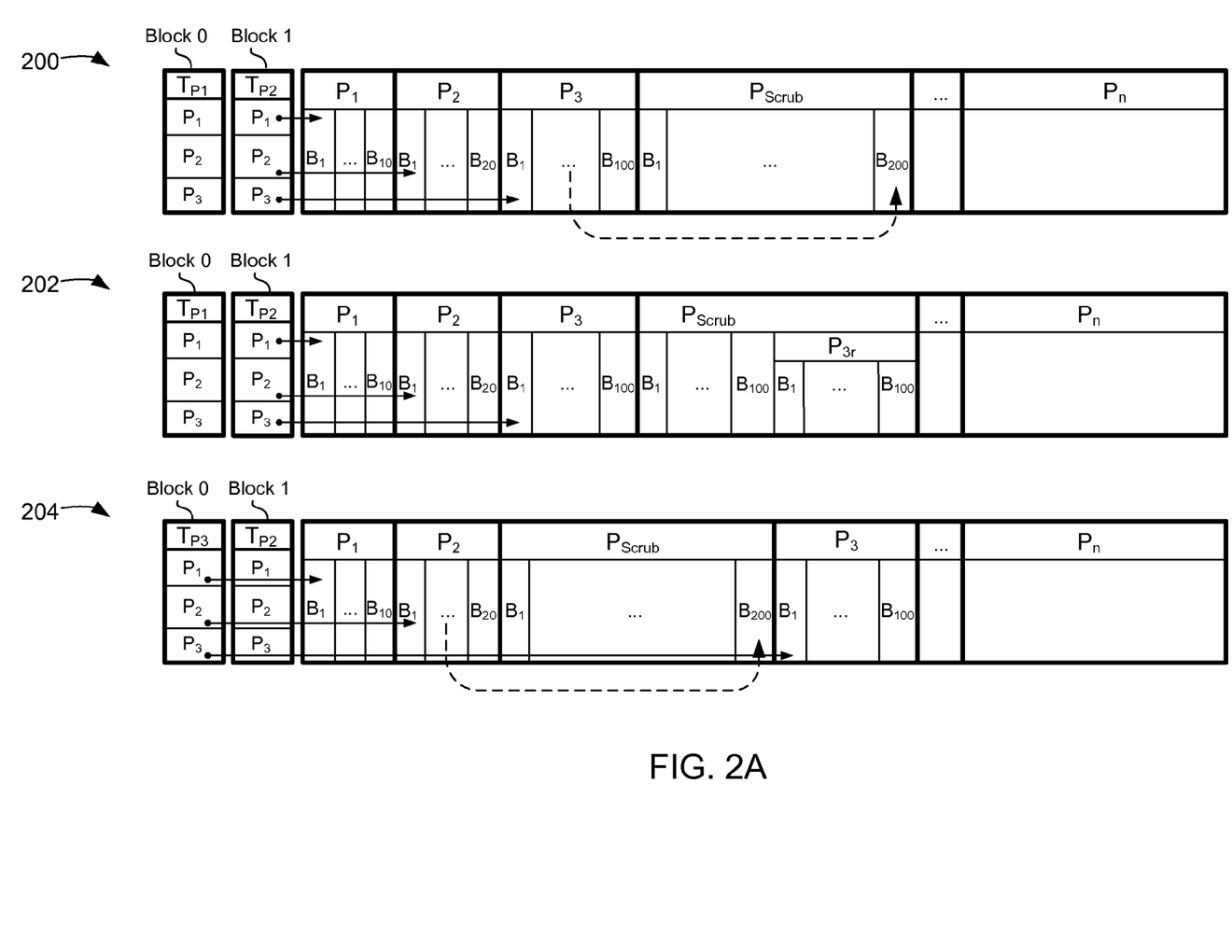
FIG. 2A is a series of schematic diagrams illustrating a series of initial process steps for refreshing a NAND device in accordance with an aspect.
Figure 2B:
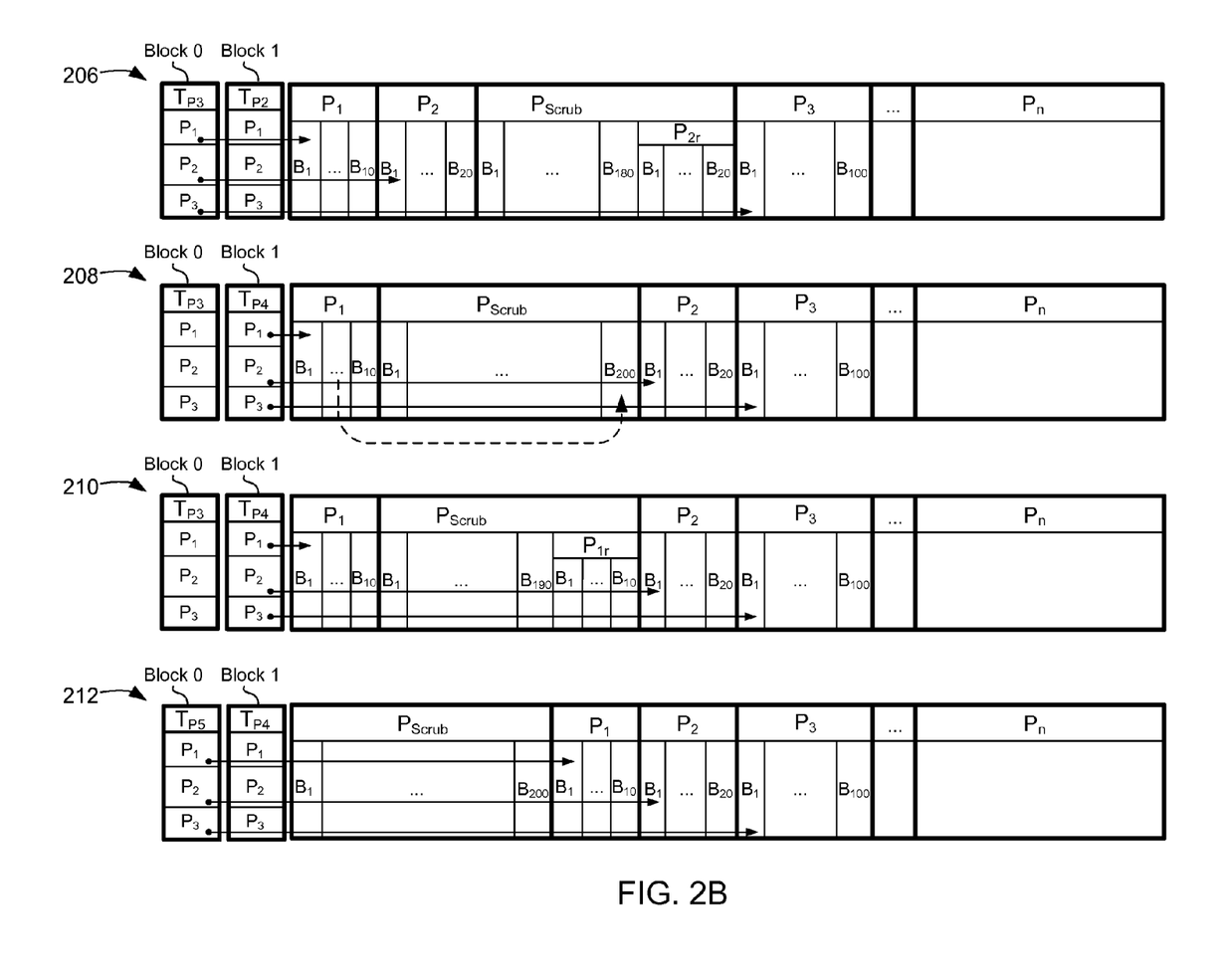
FIG. 2B is a series of schematic diagrams further illustrating process steps following the steps of FIG. 2A in accordance with an aspect.
Figure 3A:
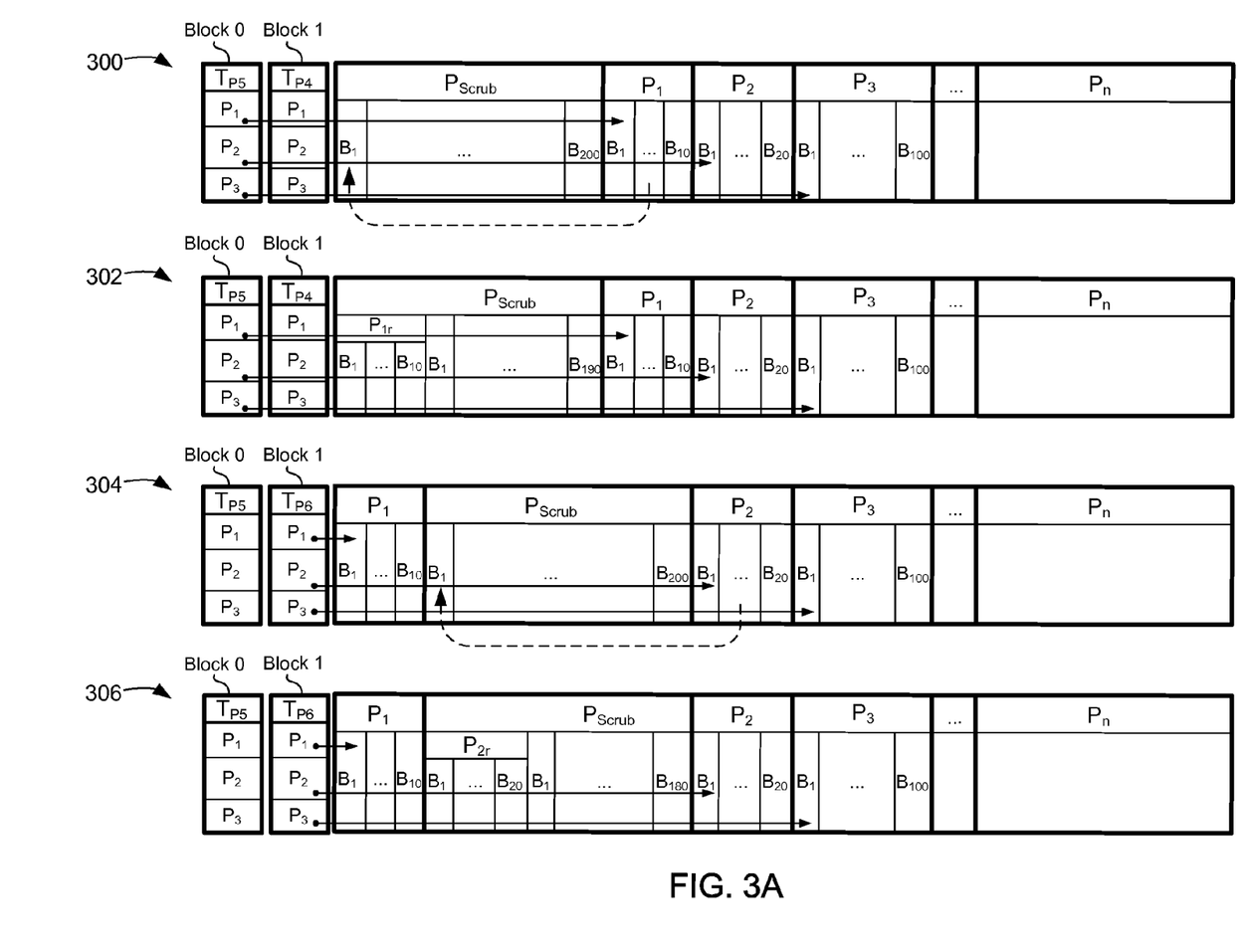
FIG. 3A is a series of schematic diagrams illustrating later process steps for refreshing a NAND device in accordance with an aspect.
Figure 3B:
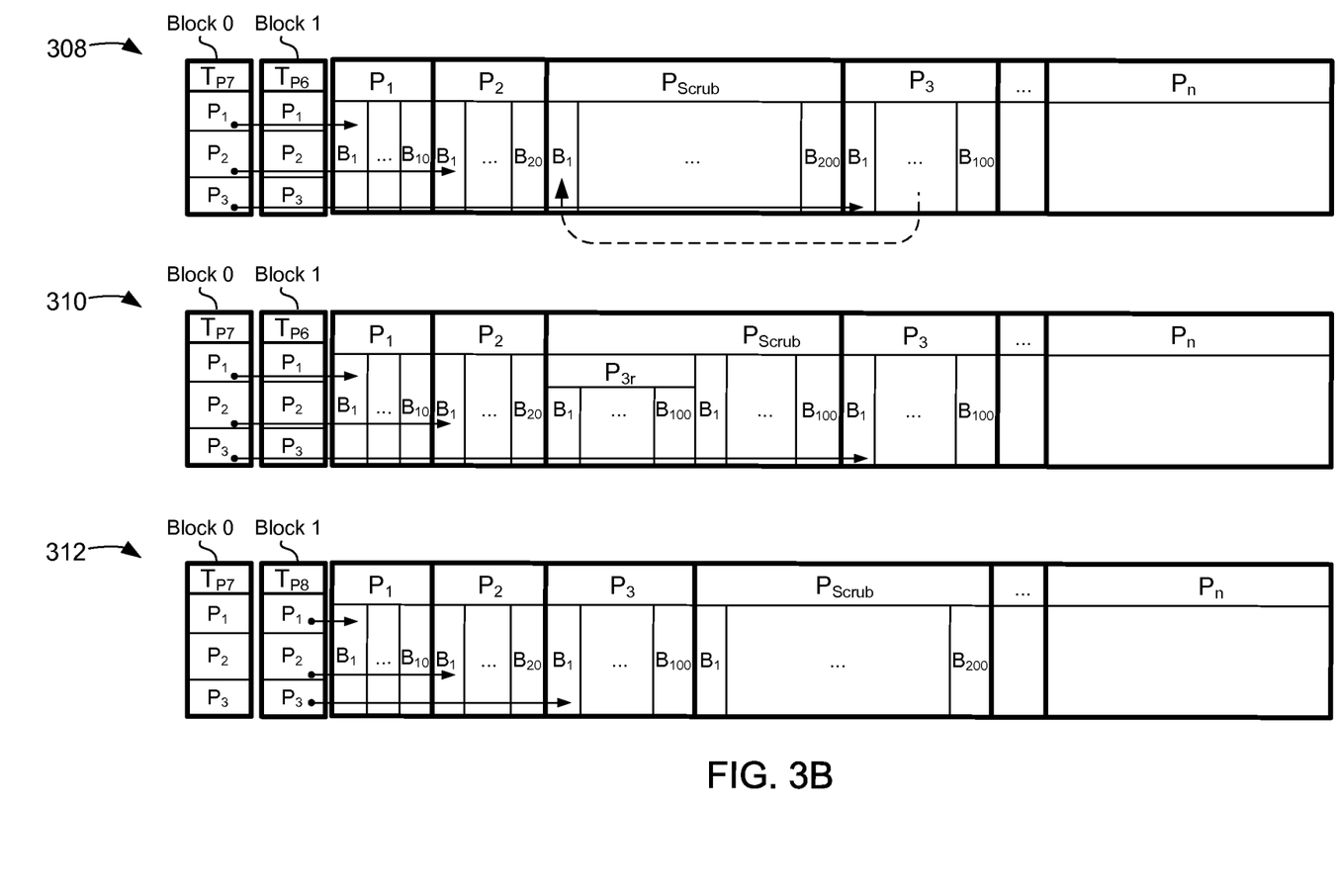
FIG. 3B is a series of schematic diagrams further illustrating process steps following the steps of FIG. 3A in accordance with an aspect.

FIGS. 2A and 2B show a series of schematic diagrams illustrating a series of process steps for refreshing a NAND device in accordance with the various aspects. Each of the schematic diagrams in FIGS. 2A and 2B represent the same NAND memory device at a different stage of an aspect data image refreshment process. Similarly, FIGS. 3A and 3B show a series of schematic diagrams illustrating a series of process steps for refreshing a NAND device in accordance with the disclosed aspects. Each of the schematic diagrams of FIGS. 3A and 3B represent the same NAND memory device at a different stage of the data image refreshment process. Also, the process steps illustrated in FIGS. 2A and 2B may be the same NAND memory device as shown in FIGS. 3A and 3B, but executed on the NAND at different times. In accordance with an aspect, the processes illustrated in FIGS. 2A and 2B may be alternated with the processes illustrated in FIGS. 3A and 3B each time a static data image stored in the NAND memory device is refreshed.

Referring to FIGS. 2A and 2B, the NAND includes a data image divided into numerous partitions, including a series of static data partitions selected to be refreshed, $P_1$, $P_2$, $P_3$, a scrub partition $P_{Scrub}$ that does not store data image partitions identified in the partition table $T_P$ and additional partitions $P_n$. Also, the NAND may include two distinct partition tables $T_{P1}$, $T_{P2}$ each containing pointers for associating blocks to a particular partition. The partition tables are stored in a predetermined range of blocks that occupy an initial region of the NAND memory device. In FIGS. 2A, 2B, 3A and 3B the partition tables are shown as occupying Block 0 and Block 1 for illustrative purposes, but the partition tables may occupy more than two blocks, need not start at Block 0, and need not be consecutive to one another. In order to accommodate for bad blocks and other elements, a range of predetermined addresses may be reserved for storing copies of the partition tables as they are, which are updated during the refreshment process herein. The two distinct partition tables $T_{P1}$, $T_{P2}$ may be updated in an alternating sequence, each time the static data image is refreshed. Each time a partition table is updated, that updated partition table may include an indication that it is the most recently updated of the two distinct partition tables. Such an indication is illustrated in FIGS. 2A, 2B, 3A and 3B as an incremental change in character "x" of the partition table reference subscript $T_{Px}$. In FIGS. 3A and 3B the two distinct partition tables start as partition tables $T_{P5}$, $T_{P4}$ and continue to be updated in an alternating manner. In this way, one of the two distinct partition tables $T_{P5}$ is the one most recently updated and the other of the two distinct partition tables $T_{P4}$ is the one less recently updated. This dual partition table configuration provides a fail safe method for updating the NAND, ensuring that one partition table is usable in case a problem (e.g., a power loss during refresh) occurs during an update of the other partition table or if something otherwise happens to the other partition table.

The series of partitions selected to be refreshed $P_1$, $P_2$, $P_3$ may be allocated to particular portions or segments of the static data, such as a trust zone (TZ) partition, a resource power management (RPM) partition, and a boot loader partition, as well as additional static data partitions that could benefit from being periodically refreshed. Such static data partitions are grouped together consecutively in the memory addresses of NAND memory device. In an aspect, the series of partitions to be refreshed are consecutive static data partitions, such that other partitions including dynamic data may be disposed before and/or after the series of static data partitions that get refreshed. In an alternative aspect, one or more dynamic data partitions may be grouped together consecutively before and/or after static data partitions and included in the series of partitions that get refreshed as described herein. In such an alternative aspect, such dynamic data partitions targeted to be refreshed may be treated as if they were static data partitions being refreshed and consecutively grouped together with the actual static data partitions being refreshed.

Additionally, a region of one or more consecutive partitions are indicated as a scrub partition $P_{Scrub}$, which is also referred to herein as a "scrub portion". The terms "scrub partition" and scrub portion are used herein to refer to a portion of the NAND memory space that does not store data image partitions that are identified in the partition table. In other words, a scrub portion of the memory is available for writing data because the memory registers and portion are either empty or store data that is no longer available to the computing device (i.e., not identified in the partition table).

During the process of refreshing a static data image, a position of the scrub partition $P_{Scrub}$ in the NAND memory device may shift as partitions are moved (i.e., copied from one group of memory locations to a portion of the scrub partition) during sequential copying of the series of partitions of the data image.

The NAND may store additional partitions $P_n$ of data that contain dynamic data, which need not be refreshed because their periodic updating ensures that the data remains fresh. Dynamic data partitions are not generally interleaved with static data partitions.

Each of the partitions in the data image may be made up of a number of blocks, but the number of blocks in each partition need not be the same. For illustrative purposes, the first partition $P_1$ is shown as including 10 blocks ($B_1 \ldots B_{10}$), the second partition $P_2$ is shown as including 20 blocks ($B_1 \ldots B_{20}$), the third partition $P_3$ is shown as including 100 blocks ($B_1 \ldots B_{100}$) and the scrub partition $P_{Scrub}$ is shown as including 200 blocks ($B_1 \ldots B_{200}$). The number of blocks in each partition may vary for different NAND devices, different data images, and over time as various portions of a data image are updated or changed.

FIGS. 2A and 2B illustrate a series of process steps for refreshing a static data image stored in a NAND memory device when the scrub partition $P_{Scrub}$ occupies higher order addresses than the series of partitions storing the data to be refreshed. In step 200, shown in FIG. 2A, copying the series of partitions $P_1$, $P_2$, $P_3$ in reverse partition order (i.e., starting with the last partition and working toward the first partition)

to the scrub portion may be started with the last partition being copied for writing into the scrub portion so its highest order data is stored in a highest address in the scrub portion. Sequential copying of the series of partitions $P_1$, $P_2$, $P_3$ generates a series of refreshed partitions $P_{1r}$, $P_{2r}$, $P_{3r}$. The process of copying the series of partitions $P_1$, $P_2$, $P_3$ in reverse partition order begins by copying the last partition $P_3$ of the series of partitions $P_1$, $P_2$, $P_3$ to an end of the scrub partition (i.e., to the highest order addresses that will store the partition). Step 202 illustrates the copy of the last one of the series of partitions $P_3$ being used to generate a last refreshed partition $P_{3r}$ occupying the end of the scrub partition $P_{Scrub}$. Once the last refreshed partition $P_{3r}$ is generated, a verification check may be performed to ensure it is an accurate copy. If the last refreshed partition $P_{3r}$ is a bad copy, the process may repeat the operation of copying the partition in step 200, which generates a refreshed partition in step 202. Otherwise, in step 204 a partition table $T_{P3}$ may be updated to change the pointer from the beginning address of the copied partition $P_3$ to point to an address or range of addresses of the refreshed partition $P_{3r}$ stored in the NAND memory device. Also, as the newest partition table pointer no longer points to the region of NAND memory previously occupied by the last one of the series of partitions $P_3$, in step 204 the last refreshed partition $P_{3r}$ may again be referred to as the last one of the series of partitions $P_3$. Additionally, by step 204 the scrub partition $P_{Scrub}$ has effectively shifted left since the initial location of the last one of the series of partitions $P_3$ has become part of the scrub partition $P_{Scrub}$. In this way, the scrub partition $P_{Scrub}$ is also now interleaved between static data partitions. It should be noted that steps 200, 202 and 204 may all happen together as a series of immediately consecutive steps. Step 204 may also include the copying of the next one in the series of partitions not already copied $P_2$ into a portion of the NAND memory adjacent to the previously copied partition.

In step 206, shown in FIG. 2B, the copied partition $P_2$ is used to generate a next refreshed partition $P_{2r}$. In effect, this next refreshed partition $P_{2r}$ may occupy the end of the newly shifted scrub partition $P_{Scrub}$. Once the next refreshed partition $P_{2r}$ is generated a verification check may be performed to ensure it is an accurate copy. If that next refreshed partition $P_{2r}$ is a bad copy, the copying process of step 204, which generates a refreshed partition in step 206 may be repeated. Otherwise, in step 208 a partition table $T_{P4}$ may be updated to change the pointer from the beginning address of the copied partition $P_2$ to point to an address or range of addresses of the refreshed partition $P_{2r}$ stored in the NAND memory device. The newest partition table pointer may no longer point to the region of NAND memory previously occupied by the copied second partition $P_2$ of the series of partitions. Thus, in step 208 the next refreshed partition $P_{2r}$ may be referred to as the second of the series of partitions $P_2$. In this way, the refreshed partition replaces the original partition from which it was copied, since that original partition from which it was copied has been absorbed into the scrub partition and is no longer recognized. Additionally, in step 208 the scrub partition $P_{Scrub}$ has effectively shifted further left since the initial location of the second of the series of partitions $P_2$ has become part of the scrub partition $P_{Scrub}$. The scrub partition $P_{Scrub}$ may still be interleaved between static data partitions. It should be noted that steps 204, 206 and 208 may all happen together as a series of immediately consecutive steps. Also, step 208 may include the copying of the next one in the series of partitions not already copied into a portion of the NAND memory adjacent to the previously copied partition. In this illustrated example the next one of the series of partitions not already copies is the first in the series of partitions $P_1$.

In step 210 the copy of the next one in the series of partitions not already copied $P_1$ is used to generate another refreshed partition $P_{1r}$ occupying memory registers adjacent to the previously copied partition, and thus beginning at the end of the shifted scrub partition $P_{Scrub}$. Once the first refreshed partition $P_{1r}$ is generated a verification check may be performed to ensure it is an accurate copy. If the first refreshed partition $P_{1r}$ is a bad copy, the copying process of step 208, which generates a refreshed partition in step 210 may be repeated. Otherwise, in step 212 a partition table $T_{P5}$ may be updated to change the pointer from the beginning address of the copied partition $P_1$ to point to an address or range of addresses of the refreshed partition $P_{1r}$ stored in the NAND memory device. Also, as the newest partition table pointer no longer points to the region of NAND memory previously occupied by the first of the series of partitions $P_1$, in step 212 the first refreshed partition $P_{1r}$ may again be referred to as the first of the series of partitions $P_1$. Thus, after copying the first one of the series of partitions $P_1$, the scrub partition $P_{Scrub}$ has shifted all the way left since the prior location of the first one of the series of partitions $P_1$ has become part of the scrub partition $P_{Scrub}$. Also, since that was the last partition to be copied of the series of partitions, the scrub partition $P_{Scrub}$ is no longer interleaved between static data partitions being refreshed, other than the partition tables $T_{P5}$, $T_{P4}$.

The series of data image partitions to be refreshed will typically include more than three partitions. For example eight to twelve partitions of static data may be refreshed, in which case the process steps described above may be repeated until all partitions have been refreshed in this manner.

The next time the static data image in the NAND memory device is refreshed, the partitions may be copied in the other direction and in reverse order as shown in FIGS. 3A and 3B, which illustrates process operations for refreshing a data image stored on a NAND memory device when the scrub partition $P_{Scrub}$ occupies addresses that are lower than the first address of the series of partitions to be refreshed. At the outset of refreshing the data image in this circumstance, the series of partitions $P_1$, $P_2$, $P_3$ may be copied in consecutive partition order to generate a series of refreshed partitions replacing at least a portion of the scrub partition.

In step 300, shown in FIG. 3A, the first one of the series of partitions $P_1$ is copied for generating a first refreshed partition. In step 302, the copy of the first one of the series of partitions $P_1$ is used to generate a first refreshed partition $P_{1r}$ occupying the beginning (i.e., lowest memory addresses) of the scrub partition $P_{Scrub}$. The process of copying the series of partitions $P_1$, $P_2$, $P_3$ in consecutive partition order initially copies the first one of the series of first partitions $P_1$ to a beginning of the scrub partition (i.e., lowest address range in the scrub portion). Once the first refreshed partition $P_{1r}$ is generated, a verification check may be performed to ensure it is an accurate copy. If the first refreshed partition $P_{1r}$ is a bad copy, the copying process in step 300, which generates a refreshed partition in step 302 may be repeated. Otherwise, in step 304 a partition table $T_{P6}$ may be updated to change the pointer from the beginning address of the copied partition $P_1$ to point to an address or range of addresses of the refreshed partition $P_{1r}$ stored in the NAND memory device. Also, as the newest partition table pointer no longer points to the region of NAND memory previously occupied by the first of the series of partitions $P_1$, in step 304 the first refreshed partition $P_{1r}$ may again be referred to as the first of the series of partitions $P_1$. Additionally, by step 304 the scrub partition $P_{Scrub}$ has effectively shifted right since the initial location of the first of the series of partitions $P_1$ has become part of the scrub partition $P_{Scrub}$. In this way, the scrub partition $P_{Scrub}$ is also now interleaved between static data partitions being refreshed. It should be noted that steps 300, 302 and 304 may all happen together as a series of immediately consecutive steps. Step 304 may also include the copying of the next one in the series of partitions not already copied $P_2$ into a portion of the NAND memory adjacent to the previously copied partition.

In step 306 the copied next one in the series of partitions not already copied $P_2$ is used to generate a next refreshed partition $P_{2r}$ occupying the beginning of the scrub partition $P_{Scrub}$. Once the next refreshed partition $P_{2r}$ is generated a verification check may be performed to ensure it is an accurate copy. If the next refreshed partition $P_{2r}$ is a bad copy, the copying process in step 304, which generates a refreshed partition in step 306 may be repeated. Otherwise, in step 308 shown in FIG. 3B, a partition table $T_7$ may be updated to change the pointer from the beginning address of the copied partition $P_2$ to point to an address or range of addresses of the refreshed partition $P_{2r}$ stored in the NAND memory device. Also, as the newest partition table pointer no longer points to the region of NAND memory previously occupied by the second of the series of partitions $P_2$, in step 308 the next refreshed partition $P_{2r}$ may again be referred to as the second of the series of partitions $P_2$. Additionally, by step 308 the scrub partition $P_{Scrub}$ has effectively shifted further right since the initial location of the second of the series of partitions $P_2$ has become part of the scrub partition $P_{Scrub}$. At this point, the scrub partition $P_{Scrub}$ is still interleaved between static data partitions being refreshed. It should be noted that steps 304, 306 and 308 may all happen together as a series of immediately consecutive steps. Also, step 308 may include the copying of the next one in the series of partitions not already copied into a portion of the NAND memory adjacent to the previously copied partition. In this illustrated example the next one of the series of partitions not already copies is the last one in the series of partitions $P_3$.

In step 310 also shown in FIG. 3B, the copy of the last one in the series of partitions not already copied $P_3$ is used to generate a last refreshed partition $P_{3r}$ occupying memory registers adjacent the beginning of the scrub partition $P_{Scrub}$. Once the third refreshed partition $P_{3r}$ is generated a verification check may be performed to ensure it is an accurate copy. If the third refreshed partition $P_{3r}$ is a bad copy, the copying process in step 308, which generates a refreshed partition in step 310, may be repeated. Otherwise, in step 312 a partition table $T_{P8}$ may be updated to change the pointer from the beginning address of the copied partition $P_3$ to point to an address or range of addresses of the refreshed partition $P_{3r}$ stored in the NAND memory device. Also, as the newest partition table pointer no longer points to the region of NAND memory previously occupied by the last of the series of partitions $P_3$, in step 312 the last refreshed partition $P_{3r}$ may again be referred to as the last one of the series of partitions $P_3$. Thus, after copying the last one of the series of partitions $P_3$, the scrub partition $P_{Scrub}$ has shifted all the way right again since the prior location of the last one of the series of partitions $P_3$ has become part of the scrub partition $P_{Scrub}$. Also, since that was the last partition to be copied of the series of partitions, the scrub partition $P_{Scrub}$ is no longer interleaved between static data partitions being refreshed, other than the partition tables $T_{P7}$, $T_{P8}$.

Again, the series of data image partitions to be refreshed will typically include more than three partitions. For example eight to twelve partitions of static data may be refreshed, in which case the process steps described above may be repeated until all partitions have been refreshed in this manner.

When the refresh process steps 200-212 illustrated in FIGS. 2A and 2B are performed, a clock may be started or a processor may store a current clock value to a memory register. Such a clock (or clock value) may enable a memory controller (or other processor) to determine when to perform the next refresh of the static data image. For example, when the clock (or clock value) indicates that four months have passed since the last data image refresh, such as when the current clock differs from the last-refreshed clock value stored in the NAND by four months, the refresh process steps 300-312 illustrated in FIGS. 3A and 3B may be performed and clock restarted or the processor may store the current clock value to the same memory register.

The aspect process for copying data image partitions within a NAND memory device are designed to provide a fail safe backup in case of power failure during any part of the refresh cycles. Additionally, an advantage of each of the above-described groups of processes is that a quantity of empty blocks needed to refresh a series of partitions is significantly less than the total quantity of blocks being copied.

In a further aspect, two distinct partition tables may be used as a further protection against errors that could occur due to lost power during the refresh process. In this aspect, while a first partition table points to address ranges of the partitions in the data image being refreshed, a second partition table may be updated to point to the new address ranges of the refreshed data image. Once the refresh process has been completed, a timestamp (or other data indicating an age of the partition table) may be added to the second partition table. This timestamp (or other age identifying data) informs a memory manager of the partition table that should be used when accessing the data image stored in the NAND memory device. Because the refresh process is accomplished before the data image becomes unreliable, use of two partition tables ensures that at least one partition table is pointing to valid data even if the process is interrupted by a power loss.

Figure 4:
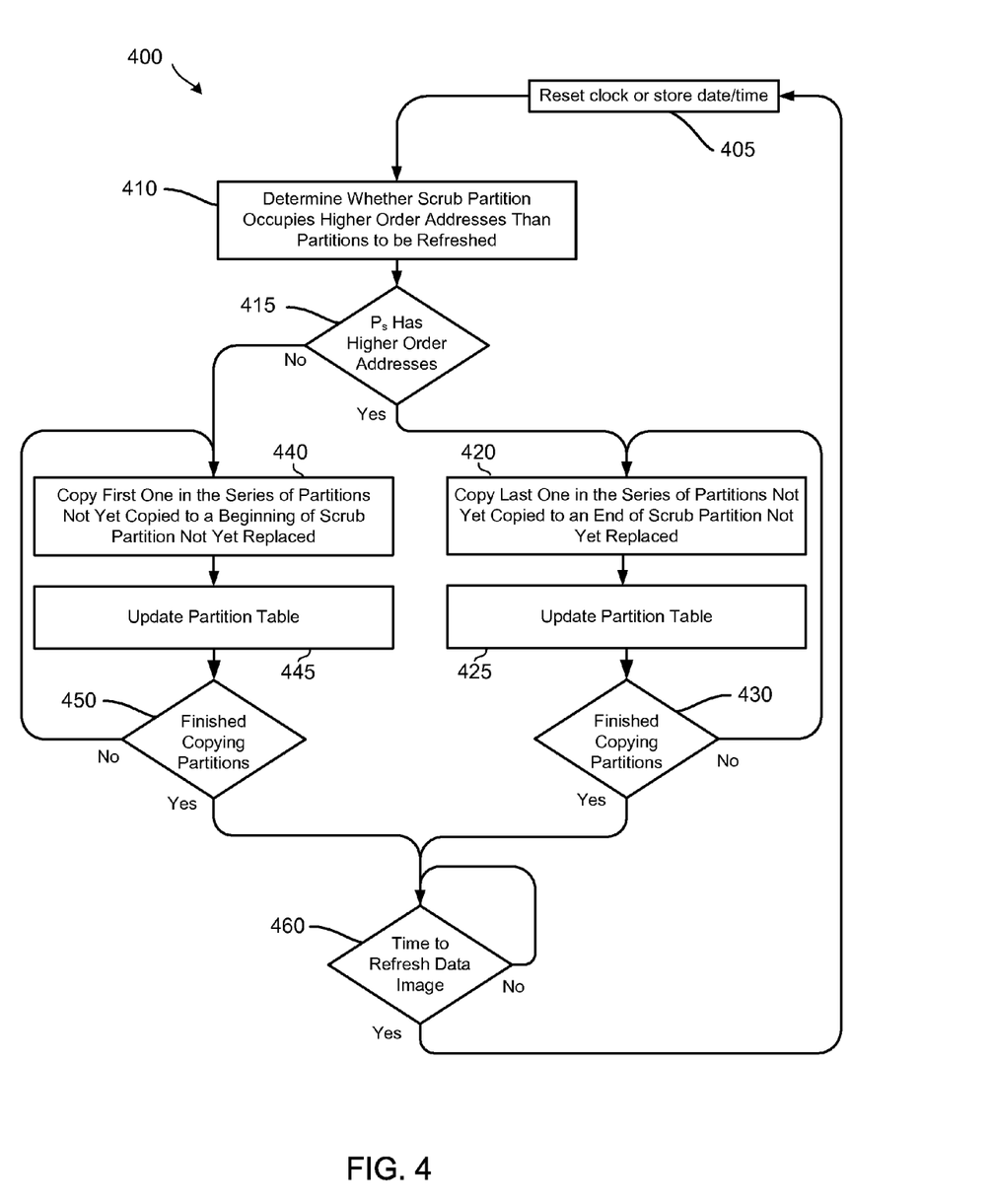
FIG. 4 is a process flow diagram illustrating an aspect method of refreshing a data image on a read-write memory.

FIG. 4 illustrates aspect method 400 for refreshing a data image on a NAND memory device that may be performed by a processor coupled to or included within the NAND memory device. In block 410 and determination block 415 the processor may determine whether a scrub partition within the NAND occupies higher order addresses than the series of partitions of the data image to be refreshed. This determination may be based upon the information stored in the partition table. As noted above, the scrub partition may be those memory addresses that are included within the range of memory addresses identified in the partition table of the data stored in the NAND memory device.

In response to the processor determining that the scrub partition occupies higher order addresses than the series of partitions to be refreshed (i.e., determination block 415="Yes"), the processor may perform the copying of the series of partitions making up the data image in reverse partition order to generate a series of refreshed partitions as illustrated in FIGS. 2A and 2B. The reverse partition order means the partition associated with the highest order addresses (i.e., the last one in the series) is copied first to an end of the scrub partition, followed by the adjacent partition with the process continues until the first partition is copied. For purposes of reference only, the first partition copied into the scrub partition is referred to as a first refreshed partition and will end up being the last of the series of refreshed partitions.

Thus, in block 420, a last one in the series of partitions to be refreshed that is not yet been refreshed is copied by the processor to an end of the scrub partition so that its highest address occupies the highest address of the scrub portion that has not been written to is part of the refresh process. A verification check may be performed on that refreshed partition to make sure it is an accurate duplicate. In response to the processor determining that the verification check is negative, the processor may repeat the copying in block 420. In response to the processor determining that the verification check is positive, in block 425 the processor may update the partition table to point to the refreshed partition. The partition table $T_P$ may include two discrete partition tables, wherein updating the partition table may include updating a rolling counter indicating which of the two partition tables was last refreshed. Thus, updating the partition table may comprise updating an oldest one of the two partition tables and saving a time value based on when the partition table was updated. Regardless, updating of the partition table means that it will no longer include pointers to the addresses previously occupied by the most recently copied partition. In this way, although the scrub partition looses blocks at one end, it gains an equal number of blocks added-on at the other end. Thus, the scrub partition shifts position with each cycle of copying through blocks 420-425. In determination block 430 the processor managing the refresh process may determine whether all of the partitions in the series of partitions have been copied or refreshed.

In response to the processor determining that there are more partitions to be refreshed (i.e., determination block 430="No"), the processor may copy the next in the series of partitions to the new end of the scrub partition in block 420, as described above. The operations in blocks 420 through 430 may be repeated by the processor in a cycle until the entire series of partitions have been copied in reverse partition order. On the second pass through the partition copying cycle, the last one in the series of partitions not yet copied is the second to last partition of the series of partitions. Also, the end of the scrub partition not yet replaced will have moved toward the beginning of the scrub partition (i.e., lower order addresses) since a first refreshed partition has replaced the last portion of the initial scrub partition. In this way, a last one of the series of partitions is copied first, the next to last one of the series of partitions is copied next and so on until all of the series of partitions get copied. Also, a last one of the series of refreshed partitions replaces a last portion of the scrub partition; the next to last one of the series of refreshed partitions replaces a next to last portion of the original scrub partition; and so on until all of the series of partitions get copied. Once all the partitions in the series are copied, the scrub partition is effectively reestablished including blocks of lower order than those of the now refreshed series of partitions constituting the data image.

Returning to determination block 415, in response to the processor determining that the scrub partition occupies lower order addresses than the series of partitions to be refreshed (i.e., determination block 415="No"), the processor may proceed with the refresh process in the opposite manner. In block 440 the processor may copy the first partition in the series of partitions to be refreshed that has not yet been copied to a beginning (i.e., in the low order addresses) of the scrub partition not yet replaced. In this circumstance, the copying of the series of partitions is performed in sequential partition order to generate the series of refreshed partitions. Sequential partition order means the partition associated with the lowest order addresses (i.e., the first one in the series) is copied first to a beginning (i.e., starting at the first address) of the scrub partition. Thus, the copy replaces the first portion of the original scrub partition. This first refreshed partition $P_{1r}$ is the first of a series of the refreshed partitions. The processor may perform a verification check on that first refreshed partition to confirm it is an accurate duplicate. In response to the processor determining that the verification check is negative, the processor may repeat the copying operation in block 440. In response to the processor determining that the verification check is positive, in block 445 the processor may update the partition table to point to the refreshed partition. In determination block 450, the processor managing the refresh process may determine whether all of the partitions in the series of partitions have been copied or refreshed.

In response to the processor determining that there are more partitions to refresh (i.e., determination block 450="No"), the processor may copy the next in the series of partitions to the new beginning of the scrub partition in block 440, as described above. The processor may repeat the operations in blocks 440 through 450 in a cycle until the entire series of partitions of the data image have been copied in sequential partition order. On the second pass through the refresh cycle, the first one in the series of first refreshed partitions not yet copied is the second partition in the series of partitions constituting the data image. Also, the beginning of the scrub partition not yet replaced will have moved toward the end of the scrub partition (i.e., higher order addresses) since a second refreshed partition has replaced the first portion of the scrub partition. In this way, a first one of the series of partitions is copied first, the next one of the series of partitions is copied next, and so on until all of the series of partitions have been copied. Also, initially a first one of the series of partitions replaces a first portion of the scrub partition, the next one of the series of partitions replaces a next portion of the scrub partition, and so on until all of the series of partitions have been copied into the initial scrub partition. Once all of the partitions in the series have been copied, the scrub partition is effectively re-established including blocks with higher order addresses and the newly refreshed series of partitions constituting the data image. Thus, the next refresh process will be performed in reverse order in operations 420 through 430 as described above.

In response to the processor determining that all partitions in the series of partitions have been copied or refreshed (i.e., determination block 430="Yes" or determination block 450="Yes") in determination block 460, the processor may check a clock or compare a stored last-refresh clock value (e.g., a date/time value) to the current clock to determine whether it is time to again refresh the data image. For example, a NAND memory device may need to be refreshed every four months to ensure the data image remains reliable even under the worst case design conditions. The processor may periodically check the clock or compare the current clock to the stored last-refreshed clock value in determination block 460 and continue waiting so long as the processor determines that it is not time to refresh the data image (i.e., determination block 460="No"). In response to the processor managing the NAND memory device determining that it is time to refresh the data image (i.e., determination block 460="Yes"), in block 405 the processor may reset the clock or or store a current time as the last-refresh date/time in a register so that the processor managing the refresh of the NAND memory device may later determine when the next refresh should be conducted. Using the reset clock time or the stored data/time from block 405, the time of the last scrub may be checked and/or a timer may be set to trigger refreshing of the static data image at a desired time in the future when the next scrub is automatically performed or scheduled to be performed. The process of refreshing the partitions described above with regard to blocks 420, 425, 430, 440, 445, 450 may be interrupted for long periods of time (e.g., the NAND memory device may be powered down for long periods), such that at boot up the device should resume the "refresh" operation. Thus, resetting the clock and/or storing a current time in block 405 before the refresh process may ensure that all static data is refreshed at most by an end of a given period, if not in a shorter period. The last-refreshed date/time may be stored in a file system portion of the NAND memory device (i.e., where dynamic data is stored). Once the clock is reset or a current date/time stored in block 405, the processor may repeat the refresh process beginning with the operations in block 410.

Rather than determining whether the scrub partition occupies a higher or lower range of addresses than the data image to be refreshed in blocks 410 and 415, the processor's determination of whether to refresh partitions in partition order (i.e., performing the operations in blocks 440-450) or reverse partition order (i.e., performing the operations in blocks 420-430) may be based upon a datum or flag stored in memory indicating either the order of the last refresh performed or the order of the next refresh to be performed. This datum or flag may be set at the conclusion of a refresh cycle, such as after all partitions have been refreshed (i.e., determination block 430="Yes" or determination block 450="Yes"). The next time a refresh is to be conducted (i.e., determination block 460="Yes") the processor may check the datum or flag and proceed accordingly with either the operations in blocks 420-430 or the operations in blocks 440-450.

As part of ensuring an accurate copy of each partition is generated, a verification check may be performed during the refresh processes described above. A verification check may be performed by various methods, including a hash-based, and a bit-by-bit analysis method. In a hash-based method, a hash function may be run on each partition and on its copy to produce respective hash values, and the two hash values compared to determine if they are the same (e.g., by subtracting the values). If the two hash values are not equal, this means that there is a bit error in the copied to partition, in which case the copy operation may be repeated. The hash values generated by the hash function acts as proxies for the original and copied data within the partition that can be quickly manipulated in a simple arithmetic function to determine whether the copy matches the original. When a comparison of the first and second hash values match, the verification check is positive, and when the comparison of the first and second hash values do not match, the verification check is negative. Because hash functions are quick to perform and the comparison is a simple arithmetic function, the hash-based verification method may be much faster and consume fewer processing resources than a bit-by-bit comparison of the original and copy partitions.

Figure 5:
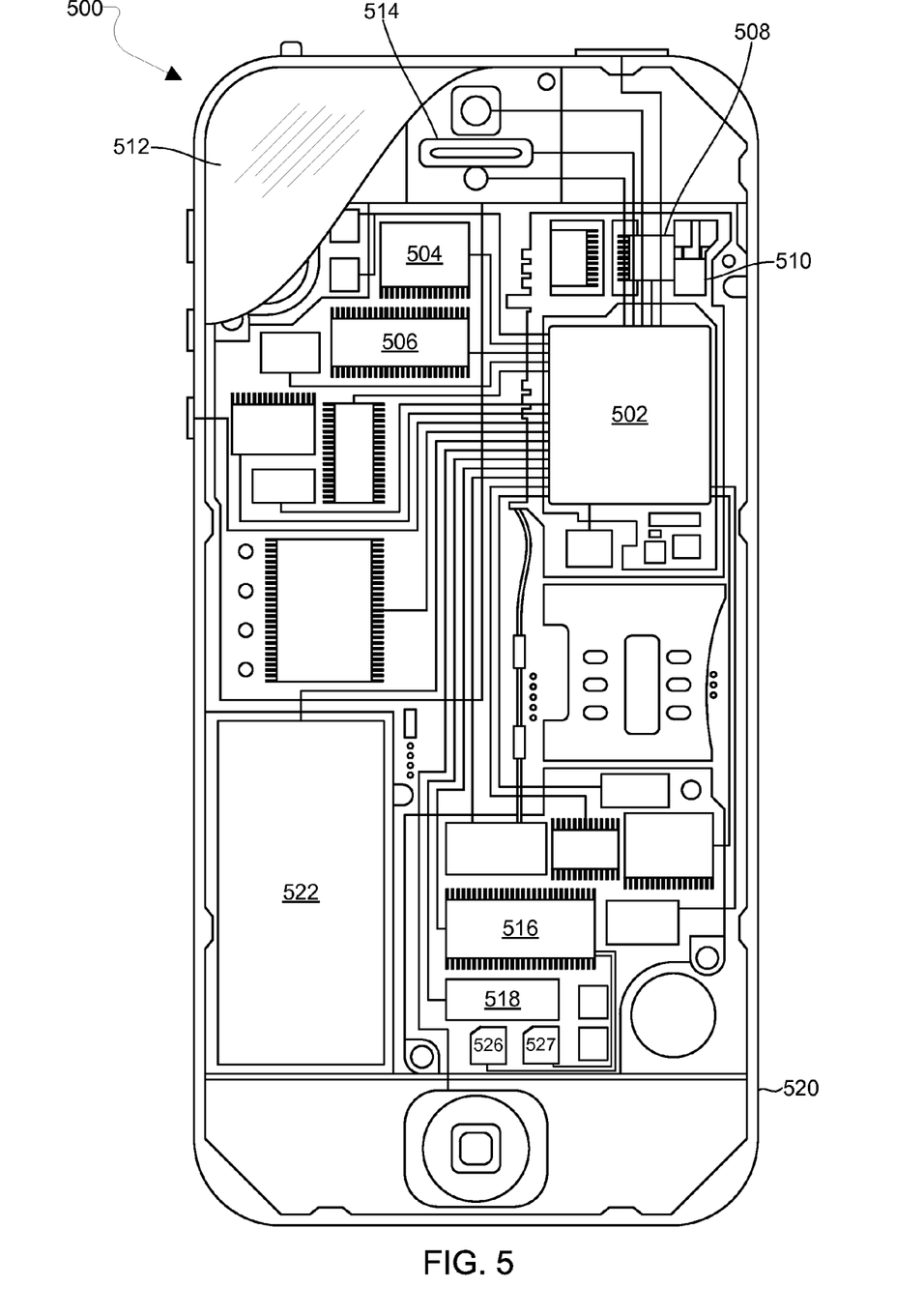
FIG. 5 is a schematic component diagram illustrating a computing device including a NAND, in accordance with various disclosed aspects.

The various aspects may be implemented in and/or with any of a variety of computing devices, an example of which is illustrated in FIG. 5 in the form of a cellular telephone. The various aspects may be implemented in and/or with any of a variety of other computing devices, such as a tablet computer, laptop computer, desktop computer or other computing device. In various aspects, the computing device 500 may include a processor 502 coupled to a touchscreen controller 504 and an internal memory 506. The processor 502 may be one or more multicore ICs designated for general or specific processing tasks. The internal memory 506 may be volatile or non-volatile memory such as NAND, and may also be secure and/or encrypted memory, or unsecure and/or unencrypted memory, or any combination thereof. The processor 502 may be coupled to a touchscreen controller 504. The touchscreen controller 504 and the processor 502 may also be coupled to a touchscreen panel 512, such as a resistive-sensing touchscreen, capacitive-sensing touchscreen, infrared sensing touchscreen, etc. Alternatively, the various aspects may be implemented in and/or with any of a variety of devices that do not include a touchscreen controller, touchscreen or any form of screen or direct data interface, such as a data card, wireless hotspot device, network component, peripheral memory device or similar "headless" devices. The computing device 500 may have one or more radio signal transceivers 508 (e.g., Peanut®, Bluetooth®, Zigbee®, Wi-Fi, RF radio) and antennae 510, for sending and receiving, coupled to each other and/or to the processor 502. The transceivers 508 and antennae 510 may be used with the above-mentioned circuitry to implement the various wireless transmission protocol stacks and interfaces. The computing device 500 may include a cellular network wireless modem chip 516 that enables communication via a cellular network and is coupled to the processor. The computing device 500 may include a peripheral device connection interface 518 coupled to the processor 502. The peripheral device connection interface 518 may be singularly configured to accept one type of connection, or multiply configured to accept various types of physical and communication connections, common or proprietary, such as USB, FireWire, Thunderbolt, or PCIe. The peripheral device connection interface 518 may also be coupled to a similarly configured peripheral device connection port (not shown). The computing device 500 may also include speakers 514 for providing audio outputs. The computing device 500 may also include a housing 520, constructed of a plastic, metal, or a combination of materials, for containing all or some of the components discussed herein. The computing device 500 may include a power source 522 coupled to the processor 502, such as a disposable or rechargeable battery. The rechargeable battery may also be coupled to the peripheral device connection port to receive a charging current from a source external to the computing device 500.

The processors in the various aspects described herein may be any programmable microprocessor, microcomputer or multiple processor chip or chips that can be configured by instructions (i.e., software instructions, such as applications) to perform a variety of functions, including the functions of the various aspects described above. In some devices, multiple processors may be provided, such as one processor dedicated to wireless communication functions and one processor dedicated to running other applications. Typically, software applications may be stored in the internal memory before they are accessed and loaded into the processors. The processors may include internal memory sufficient to store the application instructions. In many devices the internal memory may be a volatile or nonvolatile memory, such as flash memory, or a mixture of both. For the purposes of this description, a general reference to memory refers to memory accessible by the processors including internal memory or removable memory plugged into the device and memory within the processor themselves.

The foregoing method descriptions and the process flow diagrams are provided merely as illustrative examples and are not intended to require or imply that the blocks of the various aspects must be performed in the order presented. As will be appreciated by one of skill in the art the order of blocks in the foregoing aspects may be performed in any order.

Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular.

The various illustrative logical blocks and process flow diagram blocks described in connection with the aspects disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

One skilled in the relevant art will recognize that many possible modifications and combinations of the aspects of the disclosed aspects may be used, while still employing the same basic underlying mechanisms and methodologies. The foregoing description, for purposes of explanation, has been written with references to specific aspects. However, the illustrative discussions above are not intended to be exhaustive or to limit the disclosure to the precise forms disclosed. Many modifications and variations are possible in view of the above teachings. The aspects were chosen and described to explain the principles of the disclosure and their practical applications, and to enable others skilled in the art to best utilize the disclosure and various aspects with various modifications as suited to the particular use contemplated. Thus, the present disclosure is not intended to be limited to the aspects and individual aspects of the disclosed technologies shown and described herein, but is to be accorded the widest scope consistent with the following claims and the principles and novel features disclosed herein.

What is claimed is:

1. A method of refreshing a data image on a NAND memory device, wherein the data image is divided into series of partitions stored sequentially in the NAND memory device in which a first partition is stored in the NAND memory device beginning at a first address, a last partition is stored in the NAND memory device ending at a last address, and addresses of each partition are stored in a partition table, wherein the first address is a lower order address than the last address, the method comprising:
   sequentially copying, as part of one refresh cycle, a series of static data partitions into a scrub portion of the NAND memory device that does not store data image partitions identified in the partition table, wherein sequentially copying the series of static data partitions into the scrub portion comprises:
      individually copying each of the series of static data partitions beginning with a last static data partition and proceeding sequentially to a first static data partition when the scrub portion occupies one or more higher order addresses than the last address of the last static data partition in the series of static data partitions; and
      individually copying each of the series of static data partitions beginning with the first static data partition and proceeding sequentially to the last static data partition when the scrub portion occupies one or more lower order addresses than the first address of the first static data partition of the series of static data partitions; and
   updating the partition table as each static data partition is stored to the scrub portion.

2. The method of claim 1, further comprising:
   determining whether the data image should be refreshed by comparing a current clock value to a last-refreshed clock value stored in the NAND memory device;
   storing the current clock value replacing the last-refreshed clock value in response to determining that the data image should be refreshed; and
   refreshing the data image on the NAND memory device in response to storing the current clock value replacing the last-refreshed clock value.

3. The method of claim 1, further comprising:
   starting a clock before refreshing the data image on the NAND memory device;
   determining whether the clock indicates that the data image should be refreshed; and
   refreshing the data image on the NAND memory device in response to determining that the clock indicates that the data image should be refreshed.

4. The method of claim 1, further comprising determining whether the scrub portion occupies higher order addresses than the series of static data partitions based on partition addresses stored in the partition table.

5. The method of claim 1, further comprising determining whether the scrub portion occupies higher order addresses than the series of static data partitions based on a datum stored in the NAND memory device that is based on whether partitions were last refreshed beginning with the last static data partition or with the first static data partition.

6. The method of claim 1, wherein sequentially copying the series of static data partitions into the scrub portion of the NAND memory device that does not store data image partitions identified in the partition table includes performing a verification check on each copy of the series of static data partitions.

7. The method of claim 1, wherein at least one of the series of static data partitions is copied to an address previously occupied by at least one other of the series of static data partitions before refreshing the data image on the NAND memory device.

8. The method of claim 1, wherein the partition table includes two partition tables each storing a rolling counter indicating which of the two partition tables was last refreshed, wherein updating the partition table comprises updating an oldest one of the two partition tables and saving a time value in a system file based on when the partition table was updated.

9. The method of claim 1, wherein the NAND memory device includes both static data and dynamic data stored as part of the data image, and wherein the series of static data partitions that are refreshed contain the static data and dynamic data is not refreshed.

10. A computing device, comprising:
a NAND memory device storing a data image thereon, wherein the data image is divided into a series of static data partitions stored sequentially in the NAND memory device in which a first static data partition is stored in the NAND memory device beginning at a first address, a last static data partition is stored in the NAND memory device ending at a last address, and addresses of each static data partition are stored in a partition table, wherein the first address is a lower order address than the last address; and
a processor coupled to the NAND memory device and configured with processor-executable instructions to perform operations comprising:
sequentially copying, as part of one refresh cycle, a series of static data partitions into a scrub portion of the NAND memory device that does not store data image partitions identified in the partition table, wherein sequentially copying of the series of static data partitions into the scrub portion comprises:
individually copying each of the series of static data partitions beginning with the last static data partition and proceeding sequentially to the first static data partition when the scrub portion occupies one or more higher order addresses than the last address of the last static data partition in the series of static data partitions; and
individually copying each of the series of static data partitions beginning with the first static data partition and proceeding sequentially to the last static data partition when the scrub portion occupies one or more lower order addresses than the first address of the first static data partition of the series of static data partitions; and
updating the partition table as each static data partition is stored to the scrub portion.

11. The computing device of claim 10, wherein the processor is configured with processor-executable instructions to perform operations further comprising:
determining whether the data image should be refreshed by comparing a current clock value to a last-refreshed clock value stored in the NAND memory device;
storing the current clock value replacing the last-refreshed clock value in response to determining that the data image should be refreshed; and
refreshing the data image on the NAND memory device in response to storing the current clock value replacing the last-refreshed clock value.

12. The computing device of claim 10, wherein the processor is configured with processor-executable instructions to perform operations further comprising:
starting a clock before refreshing the data image on the NAND memory device;
determining whether the clock indicates that the data image should be refreshed; and
refreshing the data image on the NAND memory device in response to determining that the clock indicates that the data image should be refreshed.

13. The computing device of claim 10, wherein the processor is configured with processor-executable instructions to perform operations further comprising determining whether the scrub portion occupies higher order addresses than the series of static data partitions based on partition addresses stored in the partition table.

14. The computing device of claim 10, wherein the processor is configured with processor-executable instructions to perform operations further comprising determining whether the scrub portion occupies higher order addresses than the series of static data partitions based on a datum stored in the NAND memory device that is based on whether partitions were last refreshed beginning with the last static data partition or with the first static data partition.

15. The computing device of claim 10, wherein the processor is configured with processor-executable instructions to perform operations such that sequentially copying the series of static data partitions into the scrub portion of the NAND memory device that does not store data image partitions identified in the partition table includes performing a verification check on each copy of the series of static data partitions.

16. The computing device of claim 10, wherein the processor is configured with processor-executable instructions to perform operations such that the partition table includes two partition tables each storing a rolling counter indicating which of the two partition tables was last refreshed, wherein updating the partition table comprises updating an oldest one of the two partition tables and saving a time value in a system file based on when the partition table was updated.

17. A computing device, comprising:
a NAND memory device storing a data image that is divided into series of partitions stored sequentially in the NAND memory device in which a first partition is stored in the NAND memory device beginning at a first address, a last partition is stored in the NAND memory device ending at a last address, and addresses of each partition are stored in a partition table, wherein the first address is a lower order address than the last address; and
means for sequentially copying, as part of one refresh cycle, a series of static data partitions into a scrub portion of the NAND memory device that does not store data image partitions identified in the partition table, wherein means for sequentially copying the series of static data partitions into the scrub portion comprises:
means for individually copying each of the series of static data partitions beginning with a last static data partition and proceeding sequentially to a first static data partition when the scrub portion occupies one or more higher order addresses than the last address of the last static data partition in the series of static data partitions; and means for individually copying each of the series of static data partitions beginning with the first static data partition and proceeding sequentially to the last static data partition when the scrub portion occupies one or more lower order addresses than the first address of the first static data partition of the series of static data partitions; and means for updating the partition table as each static data partition is stored to the scrub portion.

18. The computing device of claim 17, further comprising:

means for determining whether the data image should be refreshed by comparing a current clock value to a last-refreshed clock value stored in the NAND memory device;

means for storing the current clock value replacing the last-refreshed clock value in response to determining that the data image should be refreshed; and means for initiating operations for refreshing the data image on the NAND memory device in response to storing the current clock value replacing the last-refreshed clock value.

19. The computing device of claim 17, further comprising:

means for starting a clock before refreshing the data image on the NAND memory device;

means for determining whether the clock indicates that the data image should be refreshed; and means for initiating operations for refreshing the data image on the NAND memory device in response to determining that the clock indicates that the data image should be refreshed.

20. The computing device of claim 17, further comprising means for determining whether the scrub portion occupies higher order addresses than the series of static data partitions based on partition addresses stored in the partition table.

21. The computing device of claim 17, further comprising means for determining whether the scrub portion occupies higher order addresses than the series of static data partitions based on a datum stored in the NAND memory device that is based on whether partitions were last refreshed beginning with the last static data partition or with the first static data partition.

22. The computing device of claim 17, wherein means for sequentially copying the series of static data partitions into the scrub portion of the NAND memory device that does not store data image partitions identified in the partition table includes means for performing a verification check on each copy of the series of static data partitions.

23. The computing device of claim 17, wherein the partition table includes two partition tables each storing a rolling counter indicating which of the two partition tables was last refreshed, wherein means for updating the partition table comprises means for updating an oldest one of the two partition tables and saving a time value in a system file based on when the partition table was updated.

24. A non-transitory processor-readable storage medium having stored thereon processor-executable instructions configured to cause a processor to perform operations for refreshing a data image on a NAND memory device, wherein the data image is divided into series of partitions stored sequentially in the NAND memory device in which a first partition is stored in the NAND memory device beginning at a first address, a last partition is stored in the NAND memory device ending at a last address, and addresses of each partition are stored in a partition table, wherein the first address is a lower order address than the last address, the operations comprising:

sequentially copying, as part of one refresh cycle, a series of static data partitions into a scrub portion of the NAND memory device that does not store data image partitions identified in the partition table, wherein sequentially copying the series of static data partitions into the scrub portion comprises:

individually copying each of the series of static data partitions beginning with a last static data partition and proceeding sequentially to a first static data partition when the scrub portion occupies one or more higher order addresses than the last address of the last static data partition in the series of static data partitions; and individually copying each of the series of static data partitions beginning with the first static data partition and proceeding sequentially to the last static data partition when the scrub portion occupies one or more lower order addresses than the first address of the first static data partition of the series of static data partitions; and updating the partition table as each static data partition is stored to the scrub portion.

25. The non-transitory processor-readable storage medium of claim 24, wherein the stored processor-executable instructions are configured to cause the processor to perform operations further comprising:

determining whether the data image should be refreshed by comparing a current clock value to a last-refreshed clock value stored in the NAND memory device;

storing the current clock value replacing the last-refreshed clock value in response to determining that the data image should be refreshed; and refreshing the data image on the NAND memory device in response to storing the current clock value replacing the last-refreshed clock value.

26. The non-transitory processor-readable storage medium of claim 24, wherein the stored processor-executable instructions are configured to cause the processor to perform operations further comprising:

starting a clock before refreshing the data image on the NAND memory device;

determining whether the clock indicates that the data image should be refreshed; and refreshing the data image on the NAND memory device in response to determining that the clock indicates that the data image should be refreshed.

27. The non-transitory processor-readable storage medium of claim 24, wherein the stored processor-executable instructions are configured to cause the processor to perform operations further comprising determining whether the scrub portion occupies higher order addresses than the series of static data partitions based on partition addresses stored in the partition table.

28. The non-transitory processor-readable storage medium of claim 24, wherein the stored processor-executable instructions are configured to cause the processor to perform operations further comprising determining whether the scrub portion occupies higher order addresses than the series of static data partitions based on a datum stored in the NAND memory device that is based on whether partitions were last refreshed beginning with the last static data partition or with the first static data partition.

29. The non-transitory processor-readable storage medium of claim 24, wherein the stored processor-executable instructions are configured to cause the processor to perform operations such that sequentially copying the series of static data partitions into the scrub portion of the NAND memory device that does not store data image partitions identified in the partition table includes performing a verification check on each copy of the series of static data partitions.

30. The non-transitory processor-readable storage medium of claim 24, wherein the stored processor-executable instructions are configured to cause the processor to perform operations such that the partition table includes two partition tables each storing a rolling counter indicating which of the two partition tables was last refreshed, wherein updating the partition table comprises updating an oldest one of the two partition tables and saving a time value in a system file based on when the partition table was updated.

* * * * *